US006583857B2

(12) United States Patent  
Hagiwara

(10) Patent No.: US 6,583,857 B2  
(45) Date of Patent: Jun. 24, 2003

(54) EXPOSURE APPARATUS AND ITS MAKING METHOD, AND DEVICE MANUFACTURING METHOD

(75) Inventor: Shigeru Hagiwara, Ageo (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/805,223

(22) Filed: Mar. 14, 2001

(65) Prior Publication Data

US 2001/0048083 A1 Dec. 6, 2001

Related U.S. Application Data

(63) Continuation of application No. PCT/JP99/04966, filed on Sep. 13, 1999.

(30) Foreign Application Priority Data

Sep. 14, 1998 (JP) ............................................ 10-260227

(51) Int. Cl.$^7$ ........................ G03B 27/72; G03B 27/52; G03B 27/32; G03C 5/00
(52) U.S. Cl. ............................ 355/69; 355/30; 355/53; 355/55; 355/67; 355/77; 359/507; 359/512; 430/311; 430/312
(58) Field of Search .......................... 355/30, 53, 55, 355/67, 69, 77; 359/507, 512; 430/311, 312

(56) References Cited

U.S. PATENT DOCUMENTS

| 4,699,505 A | * | 10/1987 | Komoriya et al. |
| 4,704,348 A | * | 11/1987 | Koizumi et al. |
| 4,825,247 A | * | 4/1989 | Kemi et al. |
| 5,534,970 A | * | 7/1996 | Nakashima et al. |
| 5,627,627 A | * | 5/1997 | Suzuki |
| 5,696,623 A | * | 12/1997 | Fujie et al. |
| 5,812,242 A | * | 9/1998 | Tokuda |
| 6,078,598 A | * | 6/2000 | Ohtsuki et al. |
| 6,388,733 B1 | | 5/2002 | Hayashi |
| 6,441,884 B1 | | 8/2002 | Takahashi et al. |

FOREIGN PATENT DOCUMENTS

| EP | 0 844 532 | 5/1998 |
| JP | 7-057989 | 3/1995 |
| JP | 10-106939 | 4/1998 |
| JP | 10-209040 | 8/1998 |
| JP | 10-289873 | 10/1998 |
| JP | 11-135429 | 5/1999 |
| JP | 11-219895 | 8/1999 |

* cited by examiner

Primary Examiner—Frank G. Font  
Assistant Examiner—Khaled Brown  
(74) Attorney, Agent, or Firm—Oblon, Spivak, McClelland, Maier & Neustadt, P.C.

(57) ABSTRACT

In the present invention, a light source portion including a laser resonator of a laser unit is housed in an environment control chamber where the main body of the exposure apparatus including a projection optical system is also housed, and temperature control of the main body of the exposure apparatus and the light source portion is performed so as to maintain the temperature of the entire optical system within the chamber uniform. Thus, the footprint of the apparatus can be reduced compared with when the whole laser unit is arranged separately from the main body of the exposure apparatus. Shift of the center wavelength and change in the spectral half-width and the degree of energy concentration can be avoided, and variation of image forming characteristics including the chromatic aberration of the projection optical system due to the wavelength shift can be suppressed to a minimum. Accordingly, with the exposure apparatus in the present invention, the productivity when producing a microdevice can be improved, and the production cost reduced.

26 Claims, 3 Drawing Sheets

EXPOSURE APPARATUS AND ITS MAKING METHOD, AND DEVICE MANUFACTURING METHOD

CROSS-REFERENCE TO RELATED APPLICATIONS

This is a continuation of International Application PCT/JP99/04966, with an international filing date of Sep. 13, 1999, the entire content of which being hereby incorporated herein by reference.

BACKGROUND OF THE INVENTION

1. Field of the Invention

The present invention relates to an exposure apparatus and it making method, and device manufacturing method. More particularly, the present invention relates to an exposure apparatus used to manufacture a semiconductor device and a liquid crystal display device and the like in a lithographic process and its making method, and a device manufacturing method using the exposure apparatus.

2. Description of the Related Art

Conventionally, in the photolithographic process to manufacture a semiconductor device and the like, exposure apparatus such as the so-called stepper or the so-called scanning stepper have been used. As the illuminating light for exposure apparatus such as the stepper, the emission line (g line or i line) in the ultraviolet light region emitted from an ultra-high pressure mercury lamp has been used. In recent years, however, with the requirement for higher integration in the semiconductor device pressing, in order to print a pattern with the highest integration possible on the wafer, the exposure resolution had to be improved. Therefore, inert gas or a halogen laser light source that emits an excimer laser beam having a shorter wavelength such as the KrF excimer laser beam (wavelength: 248 nm) or the ArF excimer laser beam (wavelength: 193 nm) are now becoming used as the exposure light source. It is well known, that in the case of using an excimer laser beam with a short wavelength, materials that can be used for the lens of the projection optical system at this stage are limited to materials made of fluoride crystal such as synthetic quartz, fluorite, or lithium fluoride, mainly due to the problem of transmittance of the material.

In the case of using materials such as quartz or fluorite for the lens of the projection optical system, however, it is difficult to correct the chromatic aberration in actual. Therefore, in order to prevent the image forming characteristics from deteriorating due to the chromatic aberration, what is called narrowbanding of wavelength is required, that is, to narrow the oscillation spectral width of the excimer laser beam. This narrowbanding of wavelength is performed, for example, by using the narrowbanding module (optical elements such as a combination of a prism and a grating (diffraction grating), or etalon are used) provided in the laser resonator. And, to narrowband the wavelength, the spectral width of the wavelength of the excimer laser beam supplied to the projection optical system during exposure is required to be within a predetermined wavelength at all times, and at the same time, the so-called control of wavelength stabilization is required to keep the center wavelength at a predetermined wavelength. With recent exposure apparatus using the excimer laser beam in the far ultraviolet region, the accuracy required in the narrowbanded wavelength bandwidth (spectral width) is around 1 pm ($=1\times10^{-12}$) which corresponds to around 1/300 of the natural oscillation spectral width before being narrowbanded, and the error of the center wavelength on wavelength stabilization requires the accuracy of around ±0.25 pm. In addition, as a matter of course, exposure amount control is required in these exposure apparatus.

To achieve the wavelength stabilization control, the optical properties (such as the center wavelength and the spectral half-width) of the excimer laser beam need to be monitored. The wavelength monitoring portion of the excimer laser unit is made up of etalon, which is usually a Fabry-Perot spectroscope, and a line sensor to detect its fringe pattern.

In addition, to monitor and feedback control the center wavelength and the spectral half-width of the laser beam, a spectroscopic process called deconvolution is also required. This is because when an emission line spectral emitted from an isotope mercury lamp or an iron lamp serving as a reference wavelength light source is incident on the etalon structuring the wavelength monitoring portion, a fringe pattern corresponding to the center wavelength and the spectral half-width is generated. With the fringe pattern, however, a phenomenon (convolution) occurs in which the width of the spectral half-width detected is thicker than the actual spectral half-width, due to interference of the fringe pattern with the etalon interferometer. The effect of the phenomenon, therefore, must be removed.

With the pressing requirements in recent years for an improvement in throughput, the repetition frequency of the excimer laser is becoming higher, and in order to achieve the higher repetition frequency the pulse compression circuit is becoming larger, leading to a larger excimer laser unit. Thus, the recent exposure apparatus using the excimer laser unit as the exposure light source has an arrangement that houses the main body of the exposure apparatus in a chamber called an environmental chamber where conditions such as the internal pressure, temperature, and humidity are controlled with high precision at a predetermined target value. The excimer laser unit is arranged separately outside the chamber, and is connected to the main body of the exposure apparatus by a light guiding optical system, a part of which includes a beam matching unit that is an optical system for adjusting the optical axis.

However, with the exposure apparatus using the conventional excimer laser unit described above, since the excimer laser unit was arranged separately from the main body of the exposure apparatus, a phenomenon occurred in which the optical properties of the laser beam changed while the laser beam emitted from the excimer laser unit passed through the optical system such as the light guiding optical system and the illumination optical system. This change was due to the difference in environmental conditions such as the difference in temperature and pressure between the interior of the housing of the excimer laser unit and the chamber.

Accordingly, when the spectral half-width and the like was controlled based on the detection of the fringe pattern within the housing of the excimer laser unit as was described above, the center wavelength, the spectral half-width, and the degree of energy concentration of the laser beam guided to the main body of the exposure apparatus could not be maintained at a desirable value. In such a case, since the projection optical system was adjusted only to a predetermined exposure wavelength, as a consequence, chromatic aberration of the projection optical system occurred, as well as the phenomenon of the image forming characteristics such as the magnification, distortion, and focus changing.

In addition, along with the size of the excimer laser unit increasing, to cope with the increase in chip size, the size of the main body of the exposure apparatus size is also increasing due to a larger wafer diameter and a larger stage. Thus, the footprint of the exposure apparatus in the clean room is also increasing. So, to reduce the footprint, methods such as arranging the excimer laser unit in a service room that has a lower degree of cleanliness than the clean room are being employed. With this method, however, since the light guiding optical system becomes longer, the difference in environmental conditions between the chamber where the main body of the exposure apparatus is housed and the interior of the excimer laser unit becomes larger, and the change in the optical properties of the laser beam or the change in the image forming characteristics of the projection optical system becomes more apparent.

Furthermore, when the main body of the exposure apparatus and the excimer laser unit were arranged separately as with the conventional exposure apparatus, the optical axis alignment of the laser unit and the main body of the exposure apparatus had to be performed among the laser unit, the light guiding optical system, and the illumination optical system arranged inside the main body of the exposure apparatus, which made the optical axis alignment operation troublesome and time-consuming. Accordingly, the shutdown time of the exposure apparatus during maintenance operation such as exchanging the laser was long, which led to reduction in productivity creating an unfavorable situation. In addition, when the size of the stage and its speed increased as is described above, the reaction force caused by the movement of the stage also increased, thus causing the entire main body to tilt since the main body could not endure the reaction force. In such a case, the optical axis of the light guiding system and the optical axis of the illumination optical system in the main body of the exposure apparatus diverged, which consequently led to deterioration in the quality of the transferred image.

In addition, with the integration of the semiconductor device becoming higher, the pattern line width is becoming finer, and demand for a higher resolution in the exposure apparatus is pressing. Thus, a higher N.A. in the projection optical system is also required along with a shorter wavelength in the exposure wavelength. With higher N.A., the requirement of narrowbanding in the excimer laser unit is becoming tighter, and demand for a tighter spectral half-width and degree of energy concentration is pressing. When the requirement of narrowbanding becomes tighter, the fringe pattern generated by the etalon is affected by the temperature and pressure of the etalon atmosphere. Therefore, the effect of the temperature change and the atmosphere change cannot be ignored, and it becomes difficult to perform the deconvolution process.

It is also certain, that the device rule (practical minimum line width) will be finer in the future, and with the exposure apparatus of the next generation, higher alignment precision will be required. The alignment precision depends on, for example, how the distortion component is suppressed. In addition, in order to increase the depth of focus, an increase in the UDOF (usable DOF) as well as the stability in focus is required. In either case, stability in the center wavelength and controllability of the spectral half-width is required to a high degree, and this depends on how stable and precisely the deconvolution process referred to above is performed.

SUMMARY OF THE INVENTION

The present invention has been made in consideration of the situation described above, and has as its object to provide an exposure apparatus and a device manufacturing method that can improve the productivity of the microdevice with high integration, as well as reduce the production cost of the microdevice.

According to the first aspect of the present invention, there is provided an exposure apparatus which illuminates a mask where a pattern is formed with an energy beam and transfers the pattern onto a substrate, the exposure apparatus comprising: a laser unit which includes a light source portion, and emits the energy beam; a main body of the exposure apparatus which performs exposure on the substrate with the energy beam; and an environment control chamber which houses the main body of the exposure apparatus and at least a part of the light source portion.

With the exposure apparatus, since at least a part of the light source portion structuring the laser unit is housed within the same environment control chamber as the main body of the exposure apparatus, it is possible to reduce the footprint of the apparatus compared with the conventional apparatus in which the entire laser unit is arranged separately from the main body of the exposure apparatus. In addition, environmental conditions such as the temperature or pressure of a part of, or the entire light source portion and the main body of the exposure apparatus can be maintained the same, and this makes it possible to suppress the shift of the center wavelength of the laser beam, change in spectral half-width and the degree of energy concentration due to the temperature difference between the light source portion and the main body of the exposure apparatus. Accordingly, for example, by suppressing the change in the degree of energy concentration, the controllability in the exposure amount improves, leading to improvement in exposure accuracy. Therefore, with the present invention, due to reduction in the footprint of the apparatus, the equipment cost of the clean room can be reduced which leads to a decrease in the production cost of the microdevice. And the improvement in exposure accuracy leads to an improvement in yield, resulting in improving the productivity of the microdevice.

In this case, the main body of the exposure apparatus may include a projection optical system which projects the energy beam onto the substrate. In such a case, chromatic aberration of the projection optical system due to the wavelength shift, change in magnification, image forming characteristics such as focus and distortion can be suppressed, and as a consequence, the exposure accuracy (including the overlay accuracy) can be improved.

In this case, the laser unit may be a laser unit which emits a pulse ultraviolet light of a wavelength less than 300 nm. Fluoride crystal such as fluorite is mainly used as the glass material of the projection optical system when light having such wavelength is used, and in the case of using such material, it is actually difficult to correct the chromatic aberration. Therefore, it can be said that the present invention which can almost suppress the chromatic aberration of the projection optical system shows great effectiveness.

With the exposure apparatus related to the present invention, a part of the light source portion housed in the environment control chamber may include at least a laser resonator.

"Laser resonator," here, refers not only to the laser emitting light source itself, but also refers to the entire unit in the case when the laser emitting light source and the wavelength narrowbanding element is integrated, and is used in this sense throughout the description.

In such a case, since a part of the light source portion which include the laser resonator structuring the laser unit is housed in the same environment control chamber as the main body of the exposure apparatus, the footprint of the apparatus can be reduced similarly as above. And the environmental conditions such as temperature and pressure can be maintained practically the same between the laser resonator and the main body of the exposure apparatus. Moreover, since the optical path of the laser beam becomes shorter than the case when the laser unit is arranged separately, the change in spectral half-width of the laser beam while passing through the optical path becomes smaller, and the number of optical components for light guiding can be reduced. Accordingly, the cost of the apparatus can be reduced, resulting in further reduction of the production cost of the microdevice.

In this case, it is preferable for the laser resonator to emit a pulse ultraviolet light of a wavelength less than 180 nm. With the exposure apparatus using pulse ultraviolet light having such a wavelength as the illumination light for exposure, the glass material used is limited to fluoride crystal such as fluorite, which is costly, therefore, the effect of the reduction of optical components described above becomes larger.

With the exposure apparatus related to the present invention, in the case the laser resonator is housed within the same environment control chamber as the main body of the exposure apparatus, the exposure apparatus can further comprise: an illumination optical system which guides the energy beam from the laser resonator to the mask; and a supporting member on which the laser resonator and at least a part of the illumination optical system is arranged. In such a case, when maintenance operation such as exchanging the laser resonator is performed, the coinciding operation of the optical axes of can be performed easily just by matching the optical axes of the laser resonator and the illumination optical system, thus reducing the downtime of the apparatus. In addition, even if the main body of the exposure apparatus tilts due to the movement of the stage, there is no deviation between the laser resonator and at least a part of the illumination optical system, therefore, the deterioration of the transferred image due to the deviation of the optical axes can be avoided. Accordingly, the productivity of the microdevice such as a semiconductor element can be further improved.

In this case, the illumination optical system may have a first partial optical system arranged on the supporting member and a second partial optical system arranged on a frame in the main body side of the exposure apparatus, and an optical integrator may be arranged in the second partial optical system near a border of the first partial optical system. In such a case, even if the main body of the exposure apparatus tilts due to the movement of the substrate stage which structures the main body of the exposure apparatus, there is no deviation between the laser resonator and the first partial illumination optical system. Moreover, since the optical integrator is arranged in the second partial optical system near the border of the first partial optical system, the deviation of the optical axis of the first partial optical system in respect to the second partial optical system is not a serious problem. Therefore, the deterioration of the transferred image due to the deviation of the optical axes can be avoided.

With the exposure apparatus related to the present invention, in the case the laser resonator and at least a part of the illumination optical system is arranged on the same supporting member, the part of the light source portion housed in the environment control chamber may further include a wavelength monitoring portion and a reference wavelength light source, and at least one of the wavelength monitoring portion and the reference wavelength light source may be arranged on the supporting member.

With the exposure apparatus related to the present invention, the part of the light source portion housed in the environment control chamber may include at least a wavelength monitoring portion and a reference wavelength light source. In such a case, since the wavelength monitoring portion structuring the laser unit and its reference wavelength light source is arranged within the same environment chamber as the main body of the exposure apparatus, the shift of the center wavelength due to temperature difference or pressure difference between the reference wavelength light source and the wavelength monitoring portion, change in spectral half-width and the degree of energy concentration can be suppressed to a minimum, and the change in the image forming characteristics of the projection optical system due to these factors, for example, such as change in focus and distortion can be suppressed to a minimum. Accordingly, the pattern can be transferred with higher precision.

In this case, when the laser unit is a KrF excimer laser unit, the reference wavelength light source may be an Ar ion second harmonic laser light source. The center wavelength of the Ar ion second harmonic laser light source (wavelength: 248.253 nm) is extremely close to the designed wavelength of the KrF excimer laser (wavelength: 248.385 nm) and is suitable for reference, and since the spectral half-width is extremely narrow (less than 0.01 pm) the deconvolution process can be performed with high precision, and the stability of the center wavelength and the controllability of the spectral half-width can be secured at a high degree. Accordingly, the change in image forming characteristics, especially the distortion component can be effectively suppressed and the overlay accuracy can be improved, as well as increase the UDOF and increase the depth of focus due to the stability of focus secured.

With the exposure apparatus related to the present invention, in the case a part of the light source portion housed in the environment control chamber includes at least a wavelength monitoring portion and a reference wavelength light source, the exposure apparatus can further comprise: an optical path switching unit which selectively chooses an energy beam incident on the wavelength monitoring portion from a laser resonator structuring the laser unit and the reference wavelength light source; and a control unit which performs calibration of the wavelength monitoring portion by guiding an energy beam from the reference wavelength light source into the wavelength monitoring portion via the optical path switching unit. In such a case, calibration of the wavelength monitoring portion can be performed by the control unit guiding in the energy beam from the reference wavelength light source via the optical path switching unit. Therefore, calibration of the wavelength monitoring portion (calibration of the energy beam from the laser resonator with the energy beam from the reference wavelength light source as a reference) can be performed at an appropriate interval, which makes it possible to maintain the center wavelength and the spectral half-width and the like of the energy beam emitted from the laser resonator at a desired value. As a consequence, the chromatic aberration of the projection optical system can be almost suppressed, and exposure with high precision can be performed.

In this case, it is preferable for the control unit to perform calibration of the wavelength monitoring portion during non-exposure when irradiation of the energy beam on the substrate is not required. In such a case, the calibration of the wavelength monitoring portion hardly has any effect on the throughput of the exposure apparatus. For example, the control unit may perform calibration of the wavelength monitoring portion in parallel with an exchanging process of one of the mask and the substrate, or the control unit may perform calibration of the wavelength monitoring portion in parallel with an alignment process.

With the exposure apparatus related to the present invention, in the case a part of the light source portion housed in the environment control chamber includes at least a wavelength monitoring portion and a reference wavelength light source, the part of the light source portion housed in the environment control chamber may further include a laser resonator. In such a case, as is described earlier, it is possible to reduce the footprint of the apparatus, as well as practically maintain the environmental conditions such as the temperature and pressure the same between the laser resonator and the main body of the exposure apparatus. In addition, on maintenance operations such as exchanging the laser resonator, the coinciding operation of the optical axes can be performed easily, thus reducing the downtime of the apparatus.

With the exposure apparatus related to the present invention, in the case a part of the light source portion housed in the environment control chamber includes a wavelength monitoring portion, a reference wavelength light source, and a laser resonator, the exposure apparatus can further comprise a control unit which performs temperature adjustment of said light source portion and said main body of said exposure apparatus so that temperature of all optical systems within said environment control chamber is uniform as a whole. In such a case, the shift in center wavelength of the laser beam, the change in spectral half-width and the degree of energy concentration due to the temperature difference between the light source portion and the main body of the exposure apparatus can be prevented. Accordingly, change in the magnification of the projection optical system, image forming characteristics such as focus and distortion, can be suppressed to a minimum.

According to the second aspect of the present invention, there is provided a making method of an exposure apparatus which exposes a substrate by an energy beam, the making method including: providing a laser unit which includes a light source portion, and emits the energy beam; providing an illumination system which illuminates a mask on which a pattern is formed with the energy beam from the laser unit; providing a main body of the exposure apparatus which transfers the pattern onto the substrate, the main body including a projection optical system which projects the energy beam outgoing from the mask onto the substrate; and providing an environment chamber which houses the main body of the exposure apparatus and at least a part of the light source portion.

With this making method, the exposure apparatus of the present invention can be made by incorporating the illumination optical system, the projection optical system, and other various components into the main body of the exposure apparatus, combining and adjusting these parts mechanically, electrically, and optically, and furthermore, housing at least a part of the light source portion of the laser unit and the main body of the exposure apparatus in the environment control chamber. In this case, for example, a static type projection exposure apparatus based on the step-and-repeat method can be made.

With the making method of the exposure apparatus related to the present invention, the making method may further include providing a driving unit which synchronously moves the mask and the substrate in a linear direction. In such a case, for example, a scanning type exposure apparatus based on a step-and-scan method can be made.

In addition, by using the exposure apparatus in the present invention to perform exposure in a lithographic process, a multiple layer of patterns can be accurately overlaid and formed on a substrate, which allows a microdevice with high integration to be produced with high yield, improving the productivity. Accordingly, from another aspect of the present invention, there is provided a device manufacturing method that uses the exposure apparatus of the present invention.

DESCRIPTION OF THE PREFERRED EMBODIMENT

An embodiment of the present invention will be described below with reference to FIG. 1.

Figure 1:
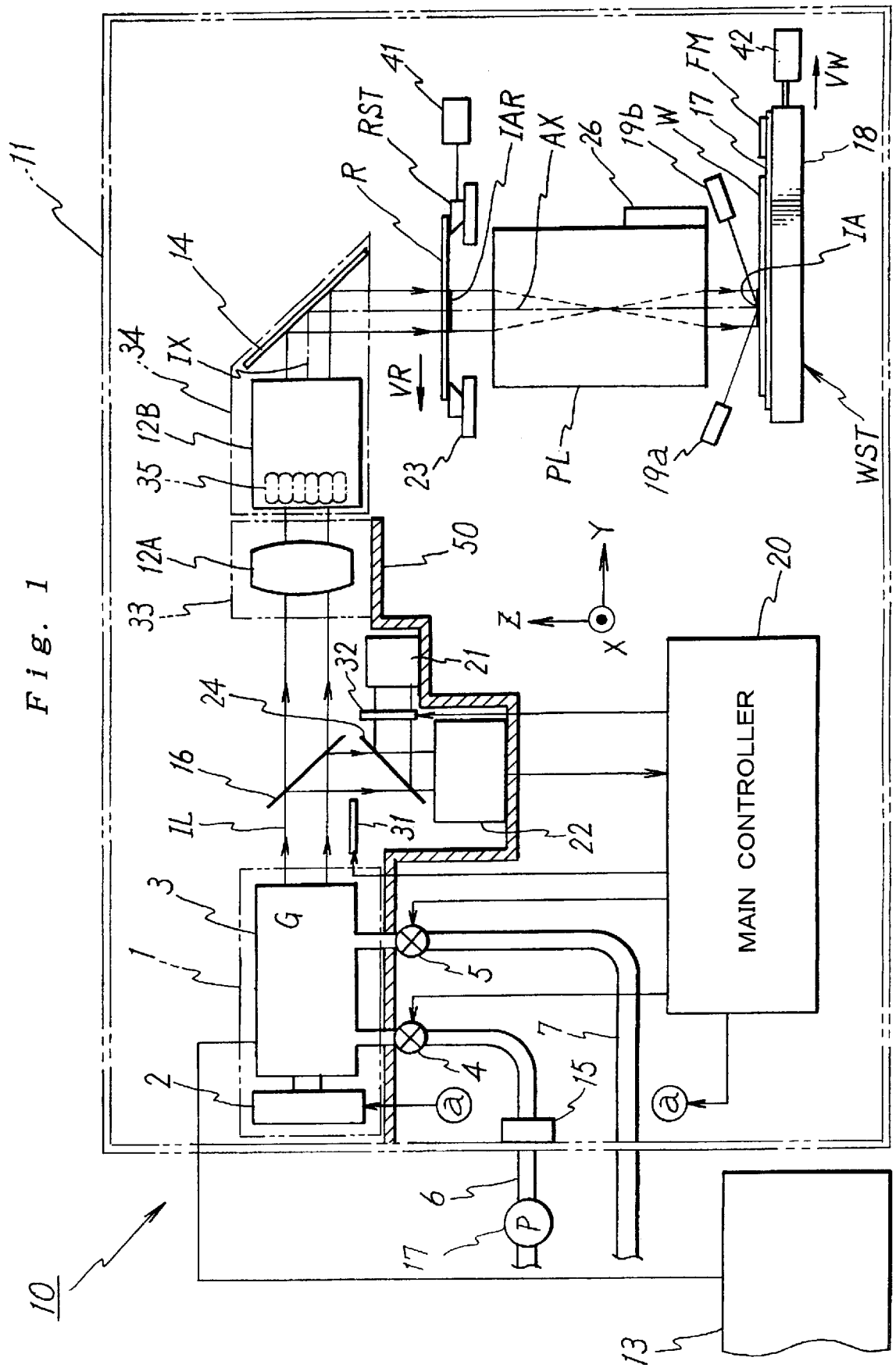
FIG. 1 is a schematic view showing the configuration of the exposure apparatus of the embodiment in the present invention.

FIG. 1 shows the schematic arrangement of an exposure apparatus 10 according to the embodiment. The exposure apparatus 10 is a scanning exposure apparatus based on the so-called step-and-scan method.

The exposure apparatus 10 comprises: a light source portion; an illumination system including an illumination optical system 12A, 12B and a mirror 14 and the like; a reticle stage RST holding the reticle R serving as a mask; a projection optical system PL; a wafer stage WST holding the wafer W serving as a substrate that moves two dimensionally within an XY plane; and a main controller 20 to control these parts, and the like. These parts that structure the exposure apparatus 10 are housed in the environmental chamber 11 (hereinafter referred to as "chamber" as appropriate) serving as an environment control chamber where the interior is dustproof and conditions such as temperature, pressure, and humidity is controlled with extremely high precision in respect to the target value.

FIG. 1 shows the chamber 11 made of a single housing, however, a plurality of space can be made by dividing the interior of the chamber with partitions, or the chamber can be made of a plurality of housings and the main body of the exposure apparatus divided and arranged respectively in the space or the housing. In this case, the environment of each space or housing may be made so that they are controlled independently. In addition, the air conditioning unit used to control the environment of the chamber may be only one or more than one. It is preferable to arrange the laser resonator within the same space or housing with a part of the illumination optical system, however, if the environment can be controlled with almost the same conditions, it is possible to arrange them in a separate space or housing.

The main controller 20 consists of a workstation (or a microcomputer), and performs overall control over the respective parts of the exposure apparatus 10. The main controller 20 does not necessarily have to be arranged within the chamber 11, however, for the sake of convenience, FIG. 1 shows the main controller 20 arranged within the chamber 11. The main controller 20, of course, may be a combination of a plurality of processors that have various functions that will be described later on.

The light source portion makes up the KrF excimer laser unit serving as a laser unit, along with the laser power supply portion 13 arranged outside the chamber 11. The light source portion includes: a laser resonator 1; a beam monitor mechanism 22 serving as a wavelength monitoring portion; and a reference wavelength light source 21 of the beam monitor mechanism 22, and the like. The laser resonator is made up of an arrow banding module 2, and a laser chamber 3 which includes a discharge electrode (not shown in Figs.).

The laser power supply portion 13 includes a high voltage power supply and a pulse compression circuit (a switching circuit) which uses the high voltage power supply to make the discharge electrode (not shown in Figs.) within the laser chamber 3 discharge at a predetermined timing.

The narrowbanding module 2 is made up of optical elements such as a prism and a diffraction grating (grating) combined or etalon (Fabry-Perot etalon) which is an interference type range filter of two plane mirrors arranged in parallel, and narrows and outputs the spectral width of the laser beam outgoing from the laser resonator 1 to around $1/100$–$1/300$ of the natural oscillation spectral width. In this case, the laser beam emitted from the laser resonator 1 is to have the center wavelength $\lambda_0$ ($\lambda_0$=248.385 nm: designed wavelength), and the spectral width $S_0$ ($S_0$: designed spectral width). In the description that follows, this laser beam is referred to as the "pulse illumination light IL" as appropriate.

The laser chamber 3 is filled with a laser gas (this gas consists of krypton Kr and fluorine $F_2$ serving as a medium, and of helium He serving as a buffer gas) G that has a predetermined concentration ratio. To the laser chamber 3, an exhausting pipe 6 which is a part of the exhausting system (not shown in Figs.) and made of a flexible tube is connected via a valve 4. The exhausting pipe 6 extends to the exterior of the environmental chamber 11, and on the inner portion of the exhausting pipe 6 inside the chamber 11, an exclusion filter 15 is arranged to trap fluorine, and outside the chamber 11 an exhausting pump 17 is arranged. The exhausting pump 17 is arranged outside so that its vibration does not affect the image forming and alignment, and also with consideration of the toxicity of fluorine so that the toxicity is removed by the exclusion filter 15 before exhausting the gas out of the chamber 11. Furthermore, a damper to remove vibration may be arranged within the chamber 11, and the exhausting pump may be arranged with the damper.

In addition, to the laser chamber 3, one end of a flexible gas pipe 7 is connected via a valve 5. The other end of the gas pipe 7 extends outside the chamber 11, and is divided and connected to the gas cylinders (not shown in Figs.) containing gas such as Kr, $F_2$, and He.

The main controller 20 controls the open/close of the valve 4 and the valve 5. For example, when the gas is injected, the main controller 20 opens the valve of the gas cylinder containing fluorine (not shown in Figs.) and the valve 5 and supplies fluorine gas $F_2$ into the laser chamber 3. And, when the gas is to be exchanged, the main controller 20 opens the valve 4 and exhausts all the deteriorated laser gas G, and operates the vacuum pump (not shown in Figs.) so that the exhaustion is further continued until the pressure falls under the atmosphere. And when this is completed, the valve 4 is closed and then the valve 5 is opened, and the main controller 20 appropriately opens/closes the respective valves connected to decompress the gas contained in each gas cylinder to a predetermined pressure with a suitable decompression valve, and supplies the respective gases to the laser chamber 3. While the injection is being performed, the main controller 20 adjusts the laser gas G within the laser chamber 3 so that it has a predetermined concentration and pressure.

Since the laser chamber 3 is a discharging portion, the temperature becomes extremely high. Therefore, in the embodiment, the laser chamber 3 is sufficiently isolated from its surroundings in respect to heat, and temperature control is performed to maintain a constant temperature with coolant such as water. That is, a cooling water piping (not shown in Figs.) is arranged around the laser chamber 3, and this cooling water piping is also connected to the exterior with the flexible tube (also not shown in Figs.). Water or other coolants supplied from the cooling device arranged outside circulates inside the cooling water piping, and the temperature of the coolant is controlled at a constant temperature by the control system of the cooling device.

The laser chamber 3 may have a thermal source such as a heater in its interior for temperature control. Or, the laser chamber 3 may be housed inside a case, and temperature control can be performed in the interior.

Downstream on the optical path of the pulse illumination light IL emitted from the laser resonator 1, a beam splitter 16 is arranged that has a transmittance of around 97% and passes almost all the pulse illumination light IL and reflects a small amount. On the optical path of the illumination light IL reflected by the beam splitter 16, the beam monitor mechanism 22 is arranged with a half mirror 24 in between. The half mirror 24 is arranged on the optical path of the light from the reference wavelength light source 21.

Furthermore, on the optical path between the beam splitter 16 and the half mirror 24, a first shutter 31 is arranged which moves in the landscape direction of FIG. 1 (Y direction) to open/close the optical path. And, on the optical path between the reference wavelength light source 21 and the half mirror 24, a second shutter 32 is arranged which moves in the direction perpendicular to the page surface of FIG. 1 (X direction) to open/close the optical path.

Accordingly, the pulse illumination light IL reflected on the beam splitter 16 and the light from the reference wavelength light source 21 can be incident on the beam monitor mechanism 22. In this case, the main controller 20 controls the open/close of the first shutter 31 and the second shutter 32 via a shutter driving mechanism (not shown in Figs.), so that the pulse illumination light IL or the light from the reference wavelength light source 21 is selectively chosen and incident on the beam monitor mechanism 22 via the half mirror 24. At a normal state, the main controller 20 opens the first shutter 31 and closes the second shutter 32, however in cases such as the absolute wavelength calibration of the beam monitor mechanism 22 which will be described later on, the first shutter 31 is closed and the second shutter 32 is opened. That is, in the embodiment, the first shutter 31 and the second shutter 32 make up an optical path switching unit which selectively chooses the energy beam to be incident on the beam monitor mechanism 22 from the laser resonator and the reference wavelength light source 21, and the main controller 20 makes up the control system to control the optical path switching unit.

The beam monitor mechanism 22 is structured of a diffuser, an etalon element, a line sensor, and an energy monitor (all omitted in Figs.). The detection signal of the beam monitor mechanism 22 is supplied to the main controller 20. The light which passes through the diffuser structuring the beam monitor mechanism 22, is then diffracted by the etalon element and forms a fringe pattern. The fringe pattern corresponds to the center wavelength and the spectral half-width of the incident light, and the line sensor outputs the image signals of the fringe pattern to the main controller 20. The main controller 20 then performs a predetermined signal processing (including the deconvolution process described earlier) to the image signals of the fringe pattern, and by this processing obtains information on the optical properties of the light incident on the beam monitor mechanism 22. In addition, at the same time, the main controller 20 detects the energy power of the pulse illumination light IL based on the output of the energy monitor.

The main controller 20 controls the laser chamber 3 and the narrowbanding module 2 (to be more specific, the driving mechanism of the spectral elements such as the grating, prism, or etalon that structure the narrowbanding module 2) based on the information regarding the optical properties of the light incident on the beam monitor mechanism 22 (the detection results of the beam monitor mechanism 22), and thus the center wavelength and the spectral half-width is controlled within a predetermined range.

In view of the fact that the spectral element such as etalon in the beam monitor mechanism 22 changes its diffraction characteristics depending on the change in temperature or pressure, in the embodiment, the main controller 20 performs temperature control over the beam monitor mechanism 22 and the reference wavelength light source 21 so as to maintain the temperature constant as is with the laser chamber 3. In this case, the temperature of the beam monitor mechanism 22 and the reference wavelength light source 21 are respectively controlled so that they are the same, and almost the same as the target temperature of the chamber 11.

The reference wavelength light source 21 is the reference light source when performing calibration on the absolute wavelength of the beam monitor mechanism 22. In this embodiment, the Ar ion second harmonic laser light source (Argon ion second harmonic laser light source) is used. The center wavelength of the Ar ion second harmonic laser light source is 248.253 nm, which is fairly close to the center wavelength $\lambda_0$=248.385 nm of the KrF excimer laser unit, and is suitable for reference. Moreover, since the spectral half-width is extremely narrow and does not exceed 0.01 pm, the deconvolution process referred to previously, can be performed with high precision. Thus, the Ar ion second harmonic laser light source is used.

The absolute wavelength calibration of the beam monitor mechanism 22, performed by the main controller 20 will be briefly described next. On performing the absolute wavelength calibration, the main controller 20 opens the first shutter 31 and closes the second shutter 32 as shown in FIG. 1, and in this state obtains information on the fringe pattern corresponding to the pulse illumination light IL from the beam monitor mechanism 22, and stores the information in the video memory (not shown in Figs.).

The main controller 20 then closes the first shutter 31 to cut off the illumination light IL incident on the beam monitor mechanism 22, and at the same time opens the second shutter 32 so that the light emitted from the reference wavelength light source 21 is incident on the beam monitor mechanism 22. And by comparing the fringe pattern obtained from the beam monitor mechanism 22 with the fringe pattern stored in the video memory (the fringe pattern of the pulse illumination light IL which was incident on the beam monitor mechanism 22 just before the shutter 31 was closed), the deviation between the wavelength of the pulse illumination light IL and the reference wavelength can be obtained. The narrowbanding module is adjusted to correct the deviation obtained, and thus the absolute wavelength calibration of the pulse illumination light IL is performed.

On comparing the fringe patterns described above, the deconvolution process is required. The convolution (thickness of the fringe pattern) subject to the deconvolution, is characteristic of each exposure apparatus, and is the amount called the apparatus function. With the conventional excimer laser apparatus which uses an isotope mercury lamp or an iron lamp as a reference wavelength light source, since the order of the apparatus function and the spectral half-width required in the excimer laser was extremely close, an accurate deconvolution process was becoming difficult. Whereas, with the embodiment, since the Ar ion second harmonic laser which spectral half-width is extremely narrow and does not exceed 0.01 pm is used as the light source, it is possible to regard the Ar ion second harmonic laser as a light having an infinitely narrow bandwidth and perform the deconvolution process with the actual waveform of the Ar ion second harmonic laser serving as the apparatus function. Accordingly, the deconvolution process can be performed accurately, and also as a consequence, the absolute wavelength calibration of the pulse illumination light IL can be performed accurately. In other words, the pulse illumination light IL can be adjusted almost accurately to the designed wavelength.

The illumination optical system is made up of two parts; a first partial optical system 12A, and a second partial optical system 12B. The first partial optical system 12A is housed in the first illumination optical system case 33, and includes the beam shaping optical system, the beam attenuating portion, and the like. The second partial optical system 12B is housed in the second illumination optical system case 34 with the mirror 14, and includes the optical system such as the fly-eye lens 35 serving as an optical integrator (a homogenizer), the field stop (the reticle blind), the relay lens system, and the condenser lens.

Although it is omitted in FIG. 1, the optical elements arranged in between the laser resonator 1 and the first partial optical system 12A (only the beam splitter 16 is arranged in this embodiment), the reference wavelength light source 21, the beam monitor mechanism 22, the half mirror 24, and the first and second shutter 31 and 32 are all housed within the same case. Also, to the interior of the laser resonator 1 and the illumination optical system (such as the illumination optical system cases 33 and 34), for example, dry air or inert gas such as nitrogen is supplied. With this arrangement, the entire optical path of the illumination light IL from the laser chamber 3 to the reticle R is filled with dry air or inert gas, so it becomes possible to prevent the illumination on the reticle R from decreasing (decrease in transmittance in the illumination optical system) which is caused by adhesion of foreign materials (siliconized organic substance, ion, and the like). The temperature and pressure of the dry air and inert gas is adjusted and supplied to the laser resonator 1 and the illumination optical system. If the air supplied to the chamber 11 is chemically clean and the degree of cleanliness of the chamber 11 can be sufficiently maintained, the illumination optical system and the like do not have to be arranged separately, as was described earlier, within the chamber 11.

Operation of the illumination system having the structure which includes the laser resonator 1, the beam splitter 16, the illumination optical system (the first partial optical system 12A, the second partial optical system 12B), and the mirror 14, and the like, will now be briefly described.

The pulse illumination light IL outgoing from the laser resonator 1 is incident on the beam splitter 16, and the light partially passes through (around 97%) the beam splitter 16 and is incident on the first partial optical system 12A. Inside the first partial optical system 12A, the beam shaping optical system forms the sectional shape of the pulse illumination light IL, then the pulse illumination light IL proceeds to the fly-eye lens 35 within the second optical system 12B via the beam attenuating portion that switches the transmittance of the laser beam in a plurality of steps. After the pulse illumination light IL passes through the fly-eye lens 35, the illumination distribution of the pulse illumination light IL is unified, and illuminates the field stop (reticle blind) which sets the illumination area IAR on the reticle R. The pulse illumination light IL which passes through the opening of the field stop then reaches the mirror 14 via the relay lens and the condenser lens, and is bent downward and illuminates the illumination area IAR on the reticle R set by the field stop with uniform illumination.

Meanwhile, as is described earlier, the remaining pulse illumination light IL (around 3%) is reflected on the beam splitter 16, and at a normal state when the first shutter is open, the reflected light is incident on the beam monitor mechanism 22 after passing through the half mirror 24.

In the embodiment, the first illumination optical system case 33 is arranged on a frame 50 serving as a supporting member. Also, on the frame 50, the laser resonator 1 which structures the light source portion of the KrF excimer laser unit, the beam monitor mechanism, and the reference wavelength light source 21 are arranged.

The first illumination optical system case 33 is arranged on the frame 50 in this embodiment, however, instead of this arrangement, the entire illumination optical system may be arranged on the frame 50. In addition, the illumination optical system is divided into two sections at the optical integrator (fly-eye lens), however, the place of where to divide the illumination optical system or the number of sections may be arbitrary. Furthermore, although it is preferable to arrange at least a part of the illumination optical system and the laser resonator 1 on the same frame, they may be arranged on different frames in the chamber 11.

The second illumination optical system case 34 is arranged on the frame (not shown in Figs.) on which the reticle stage RST, the projection optical system PL, and the wafer stage WST that will be referred to later are also arranged. In this case, the reticle stage RST, the projection optical system PL, the wafer stage WST and the frame on which these parts are arranged structure the main body of the exposure apparatus.

The main body of the exposure apparatus includes the first and second partial optical system 12A and 12B, and the mirror 14. Also, a part of the illumination optical system (in the embodiment, it is only the second illumination optical system case 34), the reticle stage RST, the projection optical system, and a part of the wafer stage WST can be arranged on a separate frame from the remaining parts, or they may all be arranged respectively on a different frame.

On the reticle stage RST, the reticle R is fixed, for example, by vacuum chucking. In this case, since the KrF excimer laser unit is used as the exposure light source, the reticle R is made of synthetic quartz.

The reticle stage RST is driven on the reticle base 23 by the reticle driving portion 41 which is structured of a linear motor and the like, and is capable of moving within a plane perpendicular to the optical axis IX of the illumination optical system (coincides with the optical axis AX of the projection optical system which will be described later) in a predetermined scanning direction (the Y-axis direction in this case) within the range of predetermined strokes. In addition, the reticle stage RST is structured so that it can move finely in the X-axis direction and also in the rotational direction around the Z-axis which is perpendicular to the XY plane so as to set the position of the reticle R.

The position of the reticle stage RST and its rotational amount (pitching amount, rolling amount, and yawing amount) are measured at all times with a reticle laser interferometer system (not shown in Figs.), for example, at a resolution of around 0.5–1 nm. The positional information on the reticle stage RST obtained by the reticle laser interferometer is sent to the main controller 20, and the main controller 20 controls the reticle stage RST based on this positional information via the reticle driving portion 41.

The projection optical system PL is arranged under the reticle stage RST, as is shown in FIG. 1, and the direction of the optical axis AX (coincides with the optical axis IX of the illumination optical system) is the Z-axis direction. The projection optical system is, for example, a double telecentric reduction system, and employs a refraction optical system which is made up of a plurality of lens elements arranged along the direction of the optical axis AX in predetermined intervals. The projection magnification of the projection optical system PL is such as ¼, ⅕, or ⅙. Therefore, when the illumination light IL from the illumination optical system illuminates the illumination area IAR on the reticle R, the illumination light IL which passes through the reticle R reduces and projects a partial image (a partial inverted image) of the pattern area (circuit pattern) of the reticle R corresponding to the inner area of the illumination area IAR onto the wafer W having photoresist coated on its surface via the projection optical system PL.

In correspondence with the fact that the KrF excimer laser beam is used as the pulse illumination light IL, each lens element structuring the projection optical system PL is only synthetic quartz, or synthetic quartz and fluorite.

On the periphery of the barrel portion of the projection optical system PL, a cooling jacket is attached, and in the cooling jacket a coolant which temperature is adjusted to a constant level is supplied and circulated. In this case, the main controller 20 controls the temperature of the coolant.

The main controller 20 performs temperature control so that the temperature of the entire optical system within the chamber 11 is almost uniform. Also, the main controller 20 performs temperature control and pressure adjustment so that each portion within the chamber 11 has almost the same target temperature and target pressure.

The wafer stage WST comprises: an XY stage 18 that is capable of moving on a base (not shown in Figs.) in the Y-axis direction (the landscape direction in FIG. 1) which is the scanning direction and in the X-axis direction (the direction perpendicular to the page surface of FIG. 1) which is perpendicular to the Y-axis direction; and a Z stage 17 that is arranged on the XY stage 18.

The XY stage 18, in actual, is driven in the XY two dimensional direction on the base by a two dimensional linear actuator (planar motor) and the like. And the Z stage 17 is driven by a driving mechanism (not shown in Figs.), for example, by three actuators (such as a voice coil motor), in the Z direction within a predetermined range (for example, within the range of 100 $\mu$m) and also can be tilted. In FIG. 1, these two dimensional linear actuator, driving mechanism and the like are representatively shown as the wafer driving unit 42.

On the Z stage 17, the wafer W is held by suction via the wafer holder (not shown in Figs.). Also, a fiducial mark plate FM on which various fiducial marks are formed is fixed on the Z stage 17, so that the surface of the plate is around the same height as the wafer W. In addition, the position of the Z stage 17 (that is, the wafer W) within the XY plane and its rotational amount (pitching amount, rolling amount, and yawing amount) are measured at all times with the wafer laser interferometer system (not shown in Figs.) at, for example, a resolution of around 0.5–1 nm. The positional information (or velocity information) on the Z stage 17 from the interferometer system is sent to the main controller 20, and the main controller 20 controls the position of the wafer W within the XY plane via the wafer driving unit 42 based on the positional information. The main controller 20 also controls the position of the wafer W in the Z direction and the tilt (in respect to the image forming plane) by using the output of the focal position detection system, which will be described later.

Furthermore, with the exposure apparatus 10 in the embodiment, a focal position detection system based on the oblique incident light method is provided. This system has an irradiation optical system 19a and a photodetection optical system 19b integrally attached to the projection optical system PL via a holding member (not shown in Figs.), and detects the Z position of the wafer W at a plurality of points respectively. As this focal position detection system 19a, 19b, a focal position detection system which details are disclosed in, for example, Japanese Patent Laid Open 06-283403 and the corresponding U.S. Pat. No. 5,448,332 and the like, is used. As long as the national laws in designated states or elected states, to which this international application is applied, permit, the disclosures cited above are fully incorporated herein by reference.

In addition, with the exposure apparatus 10 in the embodiment, an alignment system 26 based on an off-axis method is arranged on the side of the projection optical system PL to detect the alignment marks (not shown in Figs.) provided on each shot area of the wafer W. As the alignment system 26, various alignment sensors can be used, such as an image forming method alignment sensor which performs mark detection based on an image processing method by irradiating broadband light on the alignment mark (or on the fiducial mark plate FM) on the wafer and image processing the reflected light received, or an alignment sensor based on the LIA (Laser Interferometric Alignment) method which detects the diffraction light generated when the laser beam is irradiated on the grating mark. In the embodiment, as the alignment sensor 26, the image forming method alignment sensor based on the image processing method is used. Such alignment sensor is disclosed in, for example, Japanese Patent Laid Open 07-321030 and the corresponding U.S. Pat. No. 5,721,605 and the like, is used. As long as the national laws in designated states or elected states, to which this international application is applied, permit, the disclosures cited above are fully incorporated herein by reference.

Next, the operation flow in the exposure process of the exposure apparatus 10 having the arrangement described above will be briefly described.

First of all, the reticle carriage system (not shown in Figs.) exchanges (or in the case there is no reticle on the reticle stage RST, simply loads) the reticle R on the reticle stage RST, and the main controller 20 performs preparatory operations such as reticle alignment, and baseline measurement.

Next, the wafer carriage system (not shown in Figs.) exchanges the wafer on the wafer stage WST.

The method of: exchanging the reticle; reticle alignment; baseline measurement; and exchanging the wafer, is similar to that of the well known scanning stepper.

The main controller 20, then drives the wafer stage WST via the wafer driving unit 42 while monitoring the laser interferometer system (not shown in Figs.), and sequentially positions the predetermined plurality of alignment marks directly under the alignment system 26, and performs the position detection of the alignment marks. And, based on the detection results, the arrangement coordinates of all the shot areas on the wafer is obtained by a statistical technique based on a least squares method, which details are disclosed in, for example, Japanese Patent Laid Open 61-44429 and the corresponding U.S. Pat. No. 4,780,617 and the like (the alignment technique is also called "EGA (Enhanced Global Alignment)"). As long as the national laws in designated states or elected states, to which this international application is applied, permit, the disclosures cited above are fully incorporated herein by reference.

Next, the main controller 20 moves the wafer W to the starting position for scanning the first shot area based on the arrangement coordinates of the shot area on the wafer W obtained as is described above, and then scanning exposure is performed in the following manner.

That is, the reticle R is illuminated on the illumination area IAR that has a rectangular shape (slit-shaped) which longitudinal direction is perpendicular to the scanning direction (Y-axis direction) of the reticle R, while the reticle R (reticle stage RST) and the wafer W (wafer stage WST) are driven synchronously in opposite directions along the scanning direction (Y-axis direction) at a velocity ratio $V_W/V_R$ which corresponds to the projection magnification of the projection optical system PL via the reticle driving portion 41 and wafer driving portion 42. By this operation, the pattern on the pattern area of the reticle R is accurately reduced and transferred onto the shot areas on the wafer W.

In this manner, by repetitively performing stepping operations to the starting position to scan the next shot area and transferring the reticle pattern onto the shot area on the wafer W by scanning exposure, exposure based on the step-and-scan method is performed. Thus, the reticle pattern is transferred onto all the shot areas on the wafer W.

During the exposure process described above, in the reticle exchanging process, the wafer exchanging process, or the alignment process, the pulse illumination light IL is not irradiated onto the reticle.

Meanwhile, since the absolute wavelength calibration of the beam monitor mechanism 22 is performed by comparing the fringe pattern generated by the etalon, only a little time is required. Therefore, the main controller 20 performs the absolute wavelength calibration at the same time in parallel with the reticle exchange, the wafer exchange, or the alignment process. This allows absolute wavelength calibration with high precision as is described earlier, without reducing the throughput.

In addition, in the case of the embodiment, since the entire optical system within the chamber 11 is controlled so that the temperature is almost the same and the beam monitor mechanism 22 and the reference wavelength light source 21 are arranged under the same pressure, if the absolute wavelength calibration of the beam monitor mechanism 22 is performed at a constant frequency, drift of the center wavelength and the spectral half-width due to the change in temperature or pressure difference can be suppressed.

With the exposure apparatus 10 in the embodiment described so far, since the laser resonator 1 which structure the excimer laser unit and the light source portion including the beam monitor mechanism 22 and the reference wavelength light source 21 are housed in the environmental chamber 11 where the main body of the exposure apparatus is also housed, the footprint of the apparatus can be reduced compared with the case where the whole excimer laser unit was arranged separately from the main body of the exposure apparatus. That is, by making efficient use of the space that was originally available in the chamber 11, the area in which the apparatus takes up in the clean room can be reduced. Furthermore, in FIG. 1, the elements structuring the light source portion is illustrated larger than the elements structuring the main body of the exposure apparatus such as the reticle stage RST, the projection optical system PL, and the wafer stage WST. This, however, is due to the sake of convenience on drawing the figure and in explaining the details, therefore, the actual size of the respective portions is different.

In addition, the main controller 20 performs temperature control of the main body of the exposure apparatus (such as the projection optical system PL, and the stage system) and the light source portion, and the temperature of the entire optical system within the chamber 11 is controlled so as to have almost the same temperature. This allows prevention of the shift in the center wavelength of the laser beam IL, and change in the spectral half-width and the degree of energy concentration that occur due to the difference in temperature between the light source portion and the main body of the exposure apparatus. Accordingly, change in image forming characteristics due to the wavelength shift, such as change in magnification of the projection optical system, change in focus, and change in distortion, can be suppressed to a minimum.

In the embodiment, the temperature of the entire optical system within the chamber 11 is controlled so that the temperature is almost the same. If, however, the variation amount of the image forming characteristics described above is within the permissible amount, then the temperature of the optical system may be partially different.

Also, since the beam monitor mechanism 22 structuring the laser unit and the reference wavelength light source 21 of the beam monitor mechanism 22 are arranged within the chamber 11 with the main body of the exposure apparatus, there is almost no difference in pressure between the reference wavelength light source 21 and the beam monitor mechanism 22. Accordingly, the shift of the center wavelength of the laser beam IL, change in the spectral half-width and the degree of energy concentration due to the pressure difference can be suppressed to a minimum, and focus change and distortion change caused by these factors can also be suppressed to a minimum.

In addition, since the Ar ion second harmonic laser light source which spectral half-width is extremely narrow and has a center wavelength extremely close to the designed wavelength of the KrF excimer laser is used as the light source of the reference wavelength of the beam monitor mechanism 22, the deconvolution process can be performed with high precision, and the stability of the center wavelength and the controllability of the spectral half-width can be secured at a high degree. Accordingly, for example, the distortion component can be effectively suppressed and the overlay accuracy can be improved, as well as increase the UDOF and increase the depth of focus due to the stability of focus secured.

Furthermore, as the reference wavelength light source, other than the Ar ion second harmonic laser light source, a third-harmonic light source of the titanium sapphire laser (wavelength: 744 nm) or a fourth-harmonic light source of the titanium sapphire laser (wavelength: 992 nm), or a harmonics light source (a light source which emits light having a wavelength around 248 nm) of Cr:LiCAF (wavelength: 700–800 nm) or CR:LiSAF (wavelength: 800–1000 nm) which is narrowbanded with a predetermined wavelength as the center may be used.

In addition, since the laser resonator 1, beam monitor mechanism 22, and the reference wavelength light source 21 are fixed on the same frame as the partial optical system 12A which is a part of the illumination optical system that guides the pulse illumination light (energy beam) IL from the laser resonator 1 to the reticle R, when maintenance operation such as exchanging the laser resonator 1 or the narrowbanding module 2 is performed, the coinciding operation of the optical axes can be performed easily by simply making the optical axes of the laser resonator 1 and the illumination optical system (first partial optical system 12A) coincide. This can reduce the downtime of the apparatus during maintenance operation. The frequency of changing the laser resonator 1, for example, is once a year.

Also, if the main body of the exposure apparatus tilt due to the movement of the wafer stage WST and the reticle stage RST, no deviation occurs between the optical axes of the laser unit and the first partial optical system 12A. Moreover, since the fly-eye lens 35 is arranged at the entering portion of the second partial optical system 12B, the deviation of the optical axis of the first partial optical system 12A in respect to the second partial optical system 12B is hardly a problem. Accordingly, deterioration of the image transferred due to the deviation in the optical axes can be avoided.

In the embodiment above, the case has been described when the KrF excimer laser unit is used as the laser unit, however, as a matter of course, the present invention is not limited to this. For example, the ArF excimer laser unit which emits a laser beam having a wavelength of 193 nm, or the $F_2$ laser unit which emits an $F_2$ laser beam having a wavelength of 157 nm can, of course, be used. Or, the Krypton dimer laser unit which emits a $Kr_2$ laser beam having a wavelength of 146 nm, or the Argon dimer laser unit which emits an $Ar_2$ laser beam having a wavelength of 126 nm can be used, as well as laser units other than these gas lasers.

As is obvious from the description of the embodiment above, in the case the laser resonator is housed within the chamber where the projection optical system and the like are housed, the optical path of the laser beam is shorter compared with the case when the laser unit is arranged in a separate area. Accordingly, the change in the spectral half-width of the laser beam while passing through the optical path is smaller, and the number of the optical components used for guiding the light can be reduced. From these aspects, it is a great advantage especially in the case when the $F_2$ laser unit which can only use fluorite, being costly, as the glass material, is used as the exposure light source, or when the $Kr_2$ laser unit which has a shorter wavelength than the $F_2$ laser unit is used.

The material used for the reticle R or the lens of the projection optical system depends on which light source is used. That is, in the case of using the KrF excimer laser unit or the ArF excimer laser unit as the light source, synthetic quartz can be used as the material, however, in the case of using the $F_2$ laser unit, $Kr_2$ laser unit, or $Ar_2$ laser unit, fluorite needs to be used.

In addition, in the embodiment above, the laser resonator 1 is housed in the chamber 11 in consideration of the footprint of the apparatus and the optical axis adjustment, however, for example, only the beam monitor mechanism and the reference wavelength light source may be housed in the same environmental control chamber as the projection optical system PL. In such a case, it is sufficiently possible to suppress the chromatic aberration due to factors such as temperature and pressure, that is, to suppress the wavelength shift of the laser beam (illumination light for exposure) and the change in spectral half-width.

Also, a laser unit based on the injection locking method may be used, and in this case an amplifier (corresponding to at least a part of the light source portion in the invention) which amplifies the laser beam from the light source may be arranged within the chamber 11. Furthermore, with the laser excited plasma light source used in the EUV (Extreme Ultraviolet) exposure apparatus, the frame where the nozzle that releases material which generates the EUV light is housed may be arranged within the vacuum chamber.

In addition, with the embodiment above, the fly-eye lens is used as the optical integrator (homogenizer), however, instead of this arrangement, a rod integrator may be used. In the illumination optical system that uses a rod integrator, the rod integrator is arranged so that its outgoing surface is almost conjugate with the pattern surface of the reticle R. Details of the illumination optical system using the rod integrator is disclosed in, for example, U.S. Pat. No. 5,675,401. As long as the national laws in designated states or elected states, to which this international application is applied, permit, the disclosure cited above is fully incorporated herein by reference. Furthermore, the fly-eye lens and rod integrator may be combined, or two units of rod integrators may be connected in series so as to structure a double optical integrator.

The exposure apparatus of the present invention is made by assembling various subsystems including elements defined in the claims of the present application so as to keep a predetermined mechanical precision, electrical precision, and optical precision. In order to ensure these areas of precision, various optical systems, various mechanical systems, and various electrical systems are adjusted to attain a predetermined optical precision, mechanical precision, and electrical precision, respectively, prior to and after the assembly. The process of incorporating various subsystems into an exposure apparatus includes mechanical connection of various subsystems, by wiring electrical circuits, piping pressure circuits, and the like. Obviously, before the process of incorporating various subsystems into an exposure apparatus, the process of assembling the respective subsystem is performed. After the process of assembling various subsystems into the exposure apparatus, total adjustment is performed to ensure preciseness in the overall exposure apparatus. The exposure apparatus is preferably made in a clean room in which temperature, degree of cleanliness, and the like are controlled.

Also, with the embodiment above, the case is described when the present invention is applied to the scanning exposure apparatus based on the step-and-scan method, however, the application range of the present invention is not limited to this, and can be suitably applied to the static type exposure apparatus such as the stepper.

Also, for example, with the exposure apparatus which uses ultraviolet light similar to the embodiment above, the reflection system made up of only reflection optical elements or the reflection/refraction system (catadioptric system) made up of both reflection optical elements and refraction optical elements maybe used as the projection optical system. As this reflection/refraction type projection optical system, for example, a reflection/refraction system having a beam splitter and concave mirror as reflection optical elements, which is disclosed in detail in, for example, Japanese Patent Laid Open No. 08-171054 and the corresponding U.S. Pat. No. 5,668,672, Japanese Patent Laid Open No. 10-20195 and the corresponding U.S. Pat. No. 5,835,275 can be used. Or, a reflection/refraction system having a concave mirror and the like as reflection optical elements without using any beam splitter, which his disclosed in detail in, for example, Japanese Patent Laid Open No. 08-334695 and the corresponding U.S. Pat. No. 5,689,377, Japanese Patent Laid Open No. 10-3039 and the corresponding U.S. Patent Application No. 873,605 (application date: Jun. 12, 1997). As long as the national laws in designated states or elected states, to which this international application is applied, permit, the disclosures cited above are fully incorporated herein by reference.

Alternatively, the reflection/refraction system in which a plurality of refracting optical elements and two mirrors (a concave mirror serving as a main mirror, and a sub-mirror serving as a back-mirror forming a reflection plane on the side opposite to the incident plane of a refracting element or a parallel flat plate) may be used. The two mirrors are arranged on the same axis, and an intermediate image of the reticle pattern formed by the plurality of refracting optical elements is re-formed on the wafer by the main mirror and the sub-mirror, as disclosed in Japanese Patent Laid Open No. 10-104513 and the corresponding U.S. Pat. No. 5,488,229. In this reflection/refraction system, the main mirror and the sub-mirror are arranged in succession to the plurality of refracting optical elements, and the illumination light passes through a part of the main mirror and is reflected on the sub-mirror and then the main mirror. It then further proceeds through a part of the sub-mirror and reaches the wafer. As long as the national laws in designated states or elected states, to which this international application is applied, permit, the disclosures cited above are fully incorporated herein by reference.

Furthermore, as the reflection/refraction type projection optical system a reduction system may be used which projection magnification is ¼ or ⅕, has a circular image field, and is double telecentric on both the object plane side and image plane side. In the case of a scanning exposure apparatus comprising this reflection/refraction type projection optical system, the irradiation area of the illumination light can be in the field of the projection optical system having the optical axis of the projection optical system roughly as the center, and be determined in a rectangular slit shape extending in the direction almost perpendicular to the scanning direction of the reticle or the wafer. With the scanning exposure apparatus comprising such a reflection/refraction type projection optical system, even, for example, in the case of using an $F_2$ laser beam having a wavelength of 157 nm as the illumination light for exposure, a fine pattern of around a 100 nm L/S pattern can be transferred with high precision onto the wafer.

In addition, the ArF excimer laser beam or the $F_2$ laser beam is used as the vacuum ultraviolet light. However, especially in the case when only the beam monitor mechanism and the reference wavelength light source are housed in the same environmental control chamber as the projection optical system PL as is described earlier, a harmonic, which is obtained by amplifying a single-wavelength laser beam in the infrared or visible range being emitted by a DFB semiconductor laser or fiber laser with a fiber amplifier doped with erbium (or both erbium and ytteribium), and converting the wavelength into ultraviolet light using a nonlinear optical crystal, may be used.

If, for example, the oscillation wavelength of a single-wavelength laser is set within the range of 1.51 to 1.59 µm, an eighth-harmonics whose generation wavelength falls within the range of 189 to 199 nm or a tenth-harmonics whose generation wavelength falls within the range of 151 to 159 nm is output. If the oscillation wavelength is set in the range of 1.544 to 1.553 µm, in particular, an eighth-harmonics whose generation wavelength falls within the range of 193 to 194 nm, that is, ultraviolet light having almost the same wavelength as that of an ArF excimer laser beam, can be obtained. If the oscillation wavelength is set within the range of 1.57 to 1.58 µm, a tenth-harmonics whose generation wavelength falls within the range of 157 to 158 nm, that is, ultraviolet light having almost the same wavelength as that of an $F_2$ laser beam, can be obtained.

If the oscillation wavelength is set within the range of 1.03 to 1.12 µm, a seventh-harmonics whose generation wavelength falls within the range of 147 to 160 nm is output. If the oscillation wavelength is set within the range of 1.099 to 1.106 µm, in particular, a seventh-harmonics whose generation wavelength falls within the range of 157 to 158 µm, that is, ultraviolet light having almost the same wavelength as that of an $F_2$ laser beam, can be obtained. In this case, as a single-wavelength oscillation laser, for example, an ytteribium-doped fiber laser can be used.

Furthermore, the present invention can be applied to not only an exposure apparatus manufacturing microdevices such as a semiconductor element but also can be suitably applied to an exposure apparatus for transferring a circuit pattern onto a glass substrate, silicon wafer, or the like to manufacture a reticle or mask. The reticle and mask are used in an apparatus such as an optical exposure apparatus, an EUV (Extreme Ultraviolet) exposure apparatus, an X-ray exposure apparatus, an electron beam exposure apparatus, and the like. With the exposure apparatus using light such as DUV (Deep Ultraviolet) light or VUV (Vacuum Ultraviolet) light, the transmission type reticle is used in general, and as the reticle substrate material such as fused silica, fluorine doped silica glass, fluorite, magnesium fluoride, or crystal may be used. Also, with the X-ray exposure apparatus based on the proximity method or an electron beam exposure apparatus, the transmission type mask (stencil mask, membrane mask) is used, and as the mask substrate material such as silicon wafer is used.

The present invention can be suitably applied, as a matter of course, not only to an exposure apparatus to manufacture a semiconductor element, but also to an exposure apparatus to transfer a device pattern onto a glass plate used to manufacture a display such as a liquid crystal display, to transfer a device pattern onto a ceramic wafer used to manufacture thin-film magnetic heads, and an exposure apparatus used to manufacture image sensing devices (CCDs and the like).

<<Device Manufacturing Method>>

A device manufacturing method using the exposure apparatus described above in a lithographic process will be described next.

Figure 2:
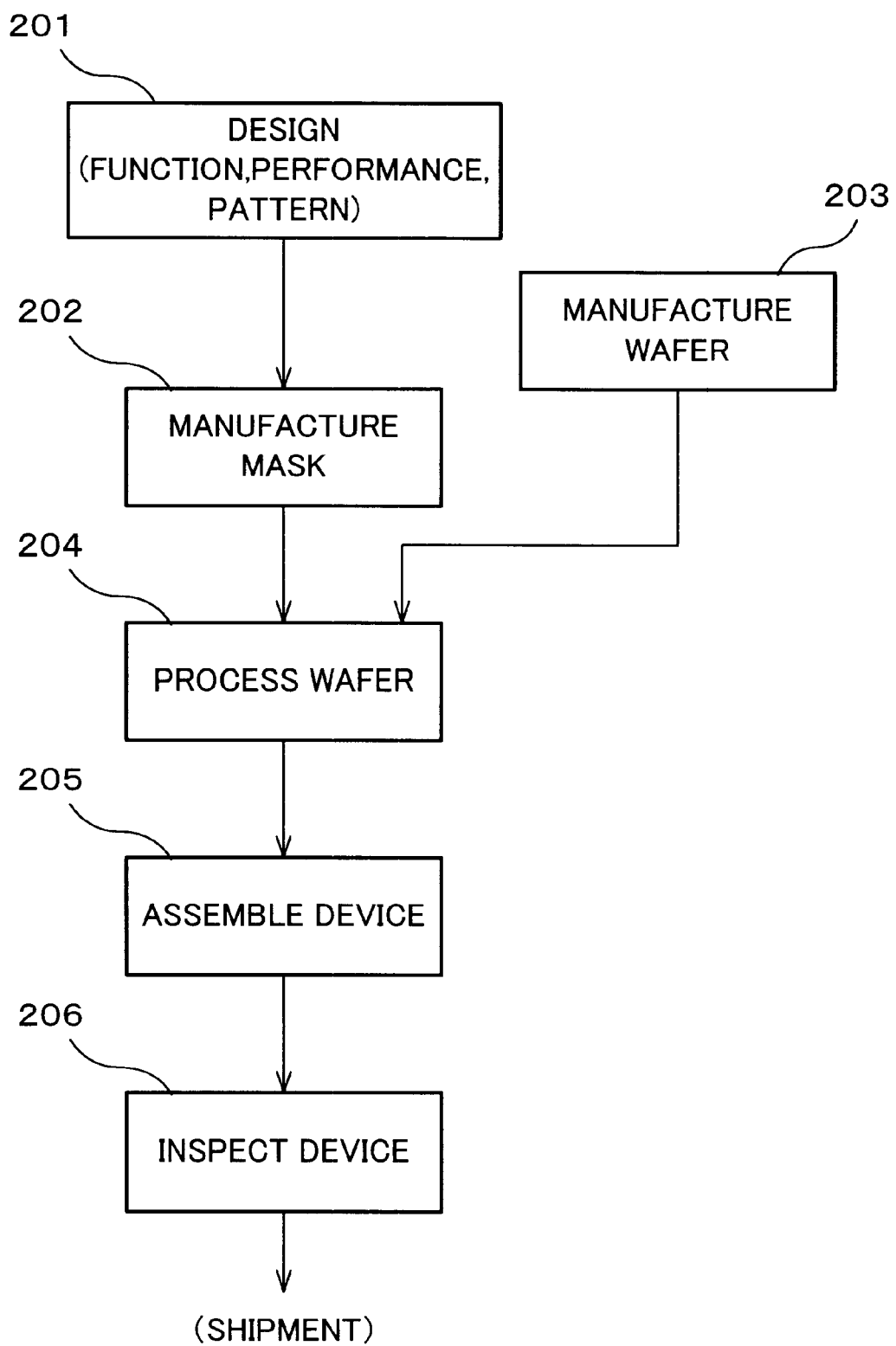
FIG. 2 is a flow chart for explaining an embodiment of a device manufacturing method according to the present invention.

FIG. 2 is a flow chart showing an example of manufacturing a device (a semiconductor chip such as an IC or LSI, a liquid crystal panel, a CCD, a thin magnetic head, a micromachine, or the like). As shown in FIG. 2, in step 201 (design step), function/performance is designed for a device (e.g., circuit design for a semiconductor device) and a pattern to implement the function is designed. In step 202 (mask manufacturing step), a mask on which the designed circuit pattern is formed is manufactured. In step 203 (wafer manufacturing step), a wafer is manufacturing by using a silicon material or the like.

In step 204 (wafer processing step), an actual circuit and the like is formed on the wafer by lithography or the like using the mask and wafer prepared in steps 201 to 203, as will be described later. In step 205 (device assembly step), a device is assembled using the wafer processed in step 204. Step 205 includes processes such as dicing, bonding, and packaging (chip encapsulation).

Finally, in step 206 (inspection step), a test on the operation of the device, durability test, and the like are performed. After these steps, the device is completed and shipped out.

Figure 3:
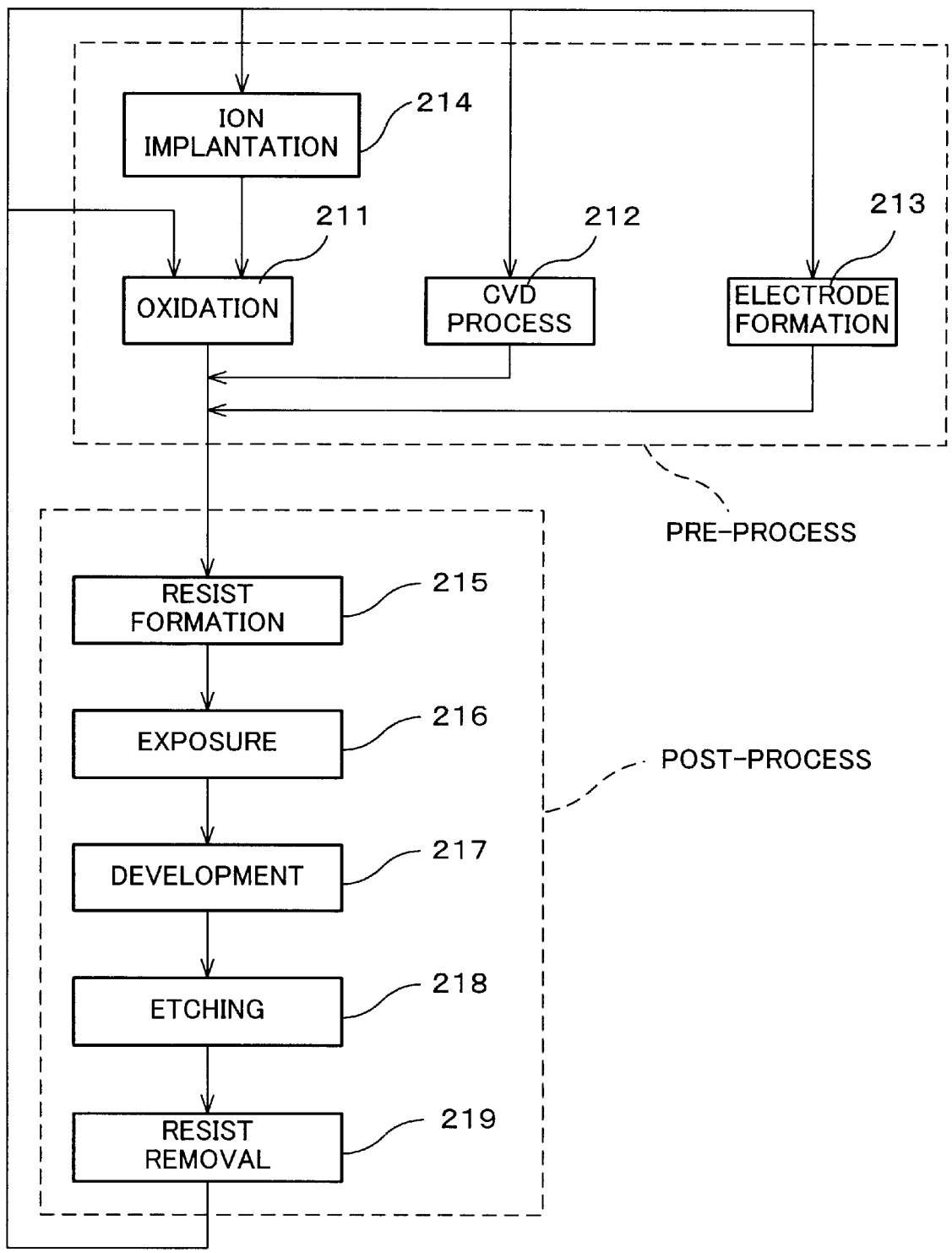
FIG. 3 is a flow chart showing the processing in step 204 in FIG. 2.

FIG. 3 is a flow chart showing a detailed example of step 204 described above in manufacturing the semiconductor device. Referring to FIG. 3, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 215 (resist formation step), the wafer is coated with a photosensitive agent. Next, as in step 216, the circuit pattern on the mask is transcribed onto the wafer by the above exposure apparatus and method. Then, in step 217 (developing step), the exposed wafer is developed. In step 218 (etching step), an exposed member on a portion other than a portion where the resist is left is removed by etching. Finally, in step 219 (resist removing step), the unnecessary resist after the etching is removed.

By repeatedly performing these pre-process and post-process steps, multiple circuit patterns are formed on the wafer.

As described above, according to the device manufacturing method of the embodiment, the exposure apparatus 10 in the embodiment above is used in the exposure process (step 216). Therefore, the exposure accuracy is improved, and a device with high integration can be manufactured with high yield, thus improving the productivity.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus which illuminates a mask where a pattern is formed with an energy beam and transfers said pattern onto a substrate, said exposure apparatus comprising:

a laser unit which includes a light source portion having a wavelength monitoring portion and a reference wavelength light source, and emits said energy beam;

a main body of said exposure apparatus which includes a projection optical system that projects said pattern onto said substrate, and performs exposure on said substrate with said energy beam; and an environment control chamber which includes said wavelength monitoring portion and said reference wavelength light source, and houses said main body of said exposure apparatus and at least a part of said light source portion.

2. The exposure apparatus according to claim 1, wherein said laser unit is a laser unit which emits a pulse ultraviolet light of a wavelength less than 300 nm.

3. The exposure apparatus according to claim 1, wherein said part of said light source portion housed in said environment control chamber includes at least a laser resonator.

4. The exposure apparatus according to claim 3, wherein said laser resonator emits a pulse ultraviolet light of a wavelength less than 180 nm.

5. The exposure apparatus according to claim 3, wherein said exposure apparatus further comprises:
  an illumination optical system which guides said energy beam from said laser resonator to said mask; and
  a supporting member on which said laser resonator and at least a part of said illumination optical system is arranged.

6. The exposure apparatus according to claim 5, wherein said illumination optical system has a first partial optical system arranged on said supporting member and a second partial optical system arranged on a frame in said main body side of said exposure apparatus, and an optical integrator is arranged in said second partial optical system near a border of said first partial optical system.

7. The exposure apparatus according to claim 5, wherein at least one of said wavelength monitoring portion and said reference wavelength light source is arranged on said supporting member.

8. The exposure apparatus according to claim 1, wherein said laser unit is a KrF excimer laser unit, and said reference wavelength light source is an Ar ion second harmonic laser light source.

9. The exposure apparatus according to claim 1, wherein said exposure apparatus further comprises:
  an optical path switching unit which selectively chooses an energy beam incident on said wavelength monitoring portion from a laser resonator structuring said laser unit and said reference wavelength light source; and
  a control unit which performs calibration of said wavelength monitoring portion by guiding an energy beam from said reference wavelength light source into said wavelength monitoring portion via said optical path switching unit.

10. The exposure apparatus according to claim 9, wherein said control unit performs calibration of said wavelength monitoring portion during non-exposure when irradiation of said energy beam on said substrate is not required.

11. The exposure apparatus according to claim 10, wherein said control unit performs calibration of said wavelength monitoring portion in parallel with an exchanging process of one of said mask and said substrate.

12. The exposure apparatus according to claim 10, wherein said control unit performs calibration of said wavelength monitoring portion in parallel with an alignment process.

13. The exposure apparatus according to claim 1, wherein said part of said light source portion housed in said environment control chamber further includes a laser resonator.

14. The exposure apparatus according to claim 13, wherein said exposure apparatus further comprises a control unit which performs temperature adjustment of said light source portion and said main body of said exposure apparatus so that temperature of all optical systems within said environment control chamber is uniform as a whole.

15. An exposure apparatus that has an illumination optical system which irradiates an energy beam on a mask and exposes a substrate with said energy beam via said mask, said exposure apparatus comprising:
  and a laser unit which includes a calibration unit of a wavelength of said energy beam, and emits said energy beam, said calibration unit having a wavelength monitoring portion and a reference wavelength light source; and
  a supporting portion on which at least a laser resonator and said wavelength monitoring portion and reference wavelength light source of said calibration unit of said laser unit, and at least a part of said illumination optical system are integrally arranged.

16. The exposure apparatus according to claim 15, wherein
  said reference wavelength light source generates a reference light having a wavelength the same as or close to a designed wavelength of said energy beam.

17. The exposure apparatus according to claim 15, wherein of said laser unit, at least a power supply portion is arranged outside of a housing where said laser resonator is arranged.

18. The exposure apparatus according to claim 15, wherein said illumination optical system has a first partial optical system which is arranged on said supporting portion, and a second partial optical system which is arranged on a different frame from said supporting portion, on a main body side of said exposure apparatus exposing said substrate with said energy beam.

19. A making method of an exposure apparatus which exposes a substrate by an energy beam, said making method including:
  providing a laser unit which includes a light source portion having a wavelength monitoring portion and a reference wavelength light source, and emits said energy beam;
  providing an illumination optical system which illuminates a mask on which a pattern is formed with said energy beam from said laser unit;
  providing a main body of said exposure apparatus which transfers said pattern onto said substrate, said main body including a projection optical system which projects said energy beam outgoing from said mask onto said substrate; and
  providing an environment control chamber which includes said wavelength monitoring portion and said reference wavelength light source, and houses said main body of said exposure apparatus and at least a part of said light source portion.

20. The making method of said exposure apparatus according to claim 19, further comprising:
  providing a driving unit which synchronously moves said mask and said substrate in a linear direction.

21. A device manufacturing method including a lithographic process, wherein exposure is performed by using said exposure apparatus according to claim 1.

22. A device manufacturing method including a lithographic process, wherein exposure is performed by using said exposure apparatus according to claim 15.

23. An exposure apparatus which exposes a substrate with an energy beam irradiated on a mask, sa d exposure apparatus comprising:

a laser unit which includes a calibration unit of a wavelength of said energy beam, and emits said energy beam, said calibration unit having a wavelength monitoring portion and a reference wavelength light source;

a main body of said exposure apparatus which includes an optical system which said energy beam passes through, and exposes said substrate with said energy beam; and an environment control unit which maintains an environment where a part of said laser unit including said wavelength monitoring portion and reference wavelength light source of said calibration unit is arranged to be substantially the same as said optical system.

24. The exposure apparatus according to claim 23, wherein said reference wavelength light source generates a reference light having a wavelength the same as or close to a designed wavelength of said energy beam.

25. The exposure apparatus according to claim 24, wherein at least a power supply portion of said laser unit is arranged outside a space where said wavelength monitoring portion and reference wavelength light source of said calibration unit is arranged.

26. The exposure apparatus according to claim 24, wherein said optical system includes an illumination optical system which irradiates said energy beam on said mask, a part of said illumination optical system being arranged within the space where said wavelength monitoring portion and reference wavelength light source of said calibration unit is arranged.

* * * * *